(12) United States Patent
Kurata et al.

(10) Patent No.: US 7,492,311 B2
(45) Date of Patent: Feb. 17, 2009

(54) PULSE WAVE RADAR DEVICE

(75) Inventors: Hitoyoshi Kurata, Tokyo (JP); Takeshi Yokoyama, Tokyo (JP)

(73) Assignee: TDK Corporation, Tokyo (JP)

( * ) Notice: Subject to any disclaimer, the term of this patent is extended or adjusted under 35 U.S.C. 154(b) by 351 days.

(21) Appl. No.: 10/561,447

(22) PCT Filed: Feb. 16, 2005

(86) PCT No.: PCT/JP2005/002320

§ 371 (c)(1),
(2), (4) Date: Dec. 20, 2005

(87) PCT Pub. No.: WO2005/081404

PCT Pub. Date: Sep. 1, 2005

(65) Prior Publication Data

US 2007/0098124 A1    May 3, 2007

(30) Foreign Application Priority Data

Feb. 24, 2004    (JP)    ............................... 2004-047832

(51) Int. Cl.
*H03K 7/00*    (2006.01)
*G01S 13/93*   (2006.01)
*G01S 7/282*   (2006.01)

(52) U.S. Cl. ..................................................... 342/134

(58) Field of Classification Search ................. 342/134; 375/353; 332/115
See application file for complete search history.

(56) References Cited

U.S. PATENT DOCUMENTS

| | | | | |
|---|---|---|---|---|
| 3,959,586 A | * | 5/1976 | Blomenkamp | 375/238 |
| 7,012,562 B2 | * | 3/2006 | Ikeda | 342/134 |
| 7,053,819 B2 | * | 5/2006 | Honya et al. | 342/134 |
| 7,145,500 B2 | * | 12/2006 | Ikeda et al. | 342/134 |
| 2005/0134502 A1 | * | 6/2005 | Ikeda | 342/135 |
| 2006/0044180 A1 | * | 3/2006 | Ikeda et al. | 342/175 |
| 2006/0066473 A1 | * | 3/2006 | Yokoyama et al. | 342/134 |
| 2006/0082492 A1 | * | 4/2006 | Honya et al. | 342/134 |
| 2006/0170586 A1 | * | 8/2006 | Honya et al. | 342/137 |
| 2007/0098124 A1 | * | 5/2007 | Kurata et al. | 375/353 |

FOREIGN PATENT DOCUMENTS

| | | | |
|---|---|---|---|
| EP | 1643266 A1 | * | 4/2006 |
| EP | 1650582 A1 | * | 4/2006 |

(Continued)

*Primary Examiner*—Dan Pihulic
(74) *Attorney, Agent, or Firm*—Oblon, Spivak, McClelland, Maier & Neustadt, P.C.

(57) ABSTRACT

A modulated pulse wave requires a pulse width of 1 nsec or less, but it is difficult that a PIN diode, which is conventionally used treats such a modulated pulse wave with narrow pulse width. In order to solve such a problem, it is an object to provide a pulse modulator, which outputs a modulated pulse wave with narrow pulse width and a pulse wave radar device, which can output a modulated pulse wave with narrow pulse width. In order to achieve this operation, the pulse modulator and the pulse wave radar device of the present invention differentiate a pulse from a pulse generating circuit so as to generate a differentiated wave with narrow width, and switch an oscillated wave from an oscillating circuit according to the differentiated wave so as to output a modulated pulse wave with narrow pulse width.

17 Claims, 18 Drawing Sheets

FOREIGN PATENT DOCUMENTS

| | | | |
|---|---|---|---|
| EP | 1737129 A1 * | 12/2006 |
| JP | 56-70573 | 6/1981 |
| JP | 07-092252 | 4/1995 |
| JP | 2000-258525 | 9/2000 |
| JP | 2003-302463 | 10/2003 |
| WO | WO 2005081404 A1 * | 9/2005 |

* cited by examiner

PULSE WAVE RADAR DEVICE

TECHNICAL FIELD

The present invention relates to a pulse modulator, which generates a modulated pulse wave with narrow pulse width and a pulse wave radar device, which uses a pulse wave. Particularly, the present invention relates to the pulse wave radar device, which measures a distance to an object at short range and accurately measures a distance to the object.

BACKGROUND ART

Various pulse wave radar devices, which measure a distance to an object based on time while a pulse wave is transmitted and the pulse wave reflected from the object is received, are known. In such pulse wave radar devices, the time from transmission of a modulated pulse wave to reception of a received wave is measured so that a signal which is proportional to a distance between the pulse wave radar devices and the objects is obtained, and the distance is calculated based on the signal.

The pulse radar devices are utilized as position/distance measuring devices, which are mounted to meteorology surveys and airplanes whose distance with respect to an object is about 100 km. In order to enhance the sensitivity in such applications, a modulated pulse wave with pulse width of about several hundred nsec is used. When, however, the modulated pulse wave with pulse width of about several hundred nsec is used even in the case where an object is at short range of about 10 cm, a reflected wave from the object is received within time of the pulse width for which a transmitting antenna transmits the modulated pulse wave, and thus a wave cannot be received normally.

For this reason, the pulse width of the modulated pulse wave is required to be 1 nsec or less, but it is difficult that a conventionally used PIN diode constitutes a pulse modulator which treats such a modulated pulse wave with narrow pulse width. As a conventional technique, a pulse modulator which uses a Schottky barrier diode or FET is proposed (for example, see Patent Document 1). The pulse width of the pulse modulator having such a configuration depends on a pulse width of a pulse generated from a pulse generating circuit.

In order to enable only the pulse generating circuit to generate a pulse with narrow pulse width, the pulse generating circuit has to be composed of elements, which operate at high speed. The elements, which operate at high speed are expensive and cause an increase in power consumption.

On the other hand, the pulse wave radar device measures time from the transmission of a transmitting wave to the reception of a receiving wave so as to obtain a signal, which is proportional to a distance from the pulse wave radar device to an object, and calculates a distance to the object from the signal. Actually, since the pulse from the pulse generating circuit is used as a start signal, an internal propagation delay of a pulse modulator or the like is estimated so that the measured time is corrected. When the modulated pulse wave with narrow pulse width is treated, however, even a slight error in internal propagation delay greatly influences an error in the measured time.

[Patent Document 1]
Japanese Patent Application Laid-Open No. 2000-258525

DISCLOSURE OF THE INVENTION

In order to solve such a problem, therefore, it is an object of the present invention to provide a pulse modulator where even when a pulse generating circuit is composed of an element, which operates at low speed, a modulated pulse wave with narrow pulse width is output.

Further, it is an object of the present invention to provide a pulse wave radar device, which has a pulse modulator capable of outputting a modulated pulse wave with narrow pulse width and can measure a distance to an object using the modulated pulse wave with narrow pulse width.

Further, it is an object of the present invention to provide a pulse wave radar device where even when an object is at short range, an error in distance measurement is small.

In order to achieve such objects, a pulse modulator of a first invention differentiates a pulse from a pulse generating circuit so as to generate a differentiated wave with narrow width, and switches an oscillated wave from an oscillating circuit according to the differentiated wave so as to output a modulated pulse wave with narrow pulse width.

Concretely, the first invention is a pulse modulator, comprising: a pulse generating circuit that generates a periodic pulse; a differentiating circuit that differentiates the pulse from the pulse generating circuit so as to output a differentiated wave; an oscillating circuit that generates an oscillated wave with modulating frequency; and a switching circuit that switches whether the oscillated wave from the oscillating circuit is output according to the differentiated wave from the differentiating circuit so as to output a modulated pulse wave.

According to the first invention, even if the pulse generating circuit is composed of an element, which operates at low speed, the pulse modulator, which can output the modulated pulse wave with narrow pulse width can be provided.

In the first invention, the differentiating circuit may be a primary high-pass filter.

According to the above invention, the pulse modulator with low power consumption can be constituted by a simple element configuration.

In the first invention, the pulse modulator may further include a clipping circuit that limits a crest value between the differentiating circuit and the switching circuit.

According to the above invention, a pulse wave with an excessive crest value can be prevented from being input into the switching circuit.

In order to achieve such objects, a pulse modulator of a second invention allows a pulse from a pulse generating circuit to pass through a band-pass circuit, and switches an oscillated wave from an oscillating circuit according to a pulse wave with a predetermined frequency component so as to output a modulated pulse wave with narrow pulse width.

Concretely, the second invention is a pulse modulator comprising: a pulse generating circuit that generates a periodic pulse; a band-pass circuit that allows a specified frequency component of the pulse from the pulse generating circuit to pass therethrough; an oscillating circuit that generates an oscillated wave of modulating frequency; and a switching circuit that switches whether the oscillate wave from the oscillating circuit is output according to an output from the band-pass circuit so as to output a modulated pulse wave.

According to the second invention, even if the pulse generating circuit is composed of an element, which operates at low speed, the pulse modulator can output a modulated pulse wave with narrow pulse width.

In the second invention, the band-pass circuit may be a secondary band-pass filter.

According to the above invention, the pulse modulator with low power consumption can be constituted by a simple element configuration.

In the second invention, the pulse modulator may further include a clipping circuit that limits a crest value between the band-pass circuit and the switching circuit.

According to the above invention, a pulse wave with an excessive crest value can be prevented from being input into the switching circuit.

In order to achieve the objects, a pulse wave radar device of a third invention has the pulse modulator according to any one of the inventions.

Concretely, the third invention is a pulse wave radar device comprising: the pulse modulator according to any one of the above inventions; a transmitting antenna that transmits a modulated pulse wave from the pulse modulator; a receiving antenna that receives a receiving wave reflected from an object; and a receiving circuit that detects the received wave from the receiving antenna so as to amplitude-demodulate to a corresponding pulse.

The pulse wave radar device of the third invention has the pulse modulator which can output a modulated pulse wave with narrow pulse width, and since the round-trip propagation time up to the object is measured by a modulated pulse wave with narrow pulse width, the round-trip propagation time up to the object even at short range can be measured.

In the third invention, the pulse wave radar device may further comprising a time calculating circuit that detects time from transmission of the modulated pulse wave to reception of the received wave so as to calculate round-trip propagation time up to the object.

According to the above invention, the round-trip propagation time up to the object can be calculated.

In order to achieve the above objects, the pulse wave radar device of a fourth invention utilizes a modulated pulse wave which leaks in the pulse wave radar device so that a distance measuring error is reduced even in the case where the object is at short range.

Concretely, the fourth invention is the pulse wave radar device characterized in that the receiving circuit detects the received wave from the receiving antenna and a modulated pulse wave, which leaks within the pulse wave radar device so as to amplitude-demodulate to a corresponding pulse.

According to the pulse wave radar device of the fourth invention, even in the case where the object is at short range, the measuring error in the round-trip propagation time up to the object can be reduced.

In the fourth invention, the pulse wave radar device may further comprising a time calculating circuit that detects an interval from the time the receiving circuit amplitude-demodulates the modulated pulse wave to the corresponding pulse to the time the receiving circuit amplitude-demodulates the received wave to the corresponding pulse so as to calculate round-trip propagation time up to the object.

According to the above invention, the round-trip propagation time up to the object can be calculated.

In order to achieve the above objects, a pulse wave radar device of a fifth invention utilizes a modulated pulse wave branched in the pulse wave radar device so that a distance measuring error is reduced even in the case where the object is at short range.

Concretely, in the fifth invention, the pulse wave radar device may further comprising: a branching circuit that branches a part of the modulated pulse wave from the pulse modulator so as to output it, wherein the receiving circuit detects the received wave from the receiving antenna and the modulated pulse wave from the branching circuit so as to amplitude-demodulate to a corresponding pulse.

According to the pulse wave radar device of the fifth invention, the round-trip propagation time can be measured even in the case where the object is at short range, and the measuring error in the round-trip propagation time up to the object can be reduced.

In the fifth invention, the pulse wave radar device may further comprising a time calculating circuit that detects an interval from the time the receiving circuit amplitude-demodulates the modulated pulse wave to the corresponding pulse to the time the receiving circuit amplitude-demodulates the received wave to the corresponding pulse so as to calculate round-trip propagation time up to the object.

According to the above invention, the round-trip propagation time up to the object can be calculated.

The pulse modulator of the invention can output a modulated pulse wave with narrow pulse width even when the pulse generating circuit is composed of the element, which operates at low speed.

Further, the pulse wave radar device of the invention has the pulse modulator, which can output a modulated pulse wave with narrow pulse width, measures the round-trip propagation time up to the object according to a modulated pulse wave with narrow pulse width, and thus can measure the round-trip propagation time even if the object is at short range.

Further, the pulse wave radar device of the invention can measure the round-trip propagation time even if the object is at short range, and can reduce the measuring error in the round-trip propagation time up to the object.

11: pulse generating circuit, 12: differentiating circuit, 13: switching circuit, 14: oscillating circuit, 15: transmitting antenna, 16: distributing circuit, 17: branching circuit, 18: band-pass circuit, 21: receiving antenna, 22: detecting circuit, 23: amplifying circuit, 24: comparison circuit, 25: time calculating circuit, 26: time calculating circuit, 27: multiplexing circuit, 31: input terminal, 32: output terminal, 33: capacitor, 34: resistance, 35: diode, 36: resistance, 37: inductor, 41: flip-flop circuit, 42: low-pass filter, 43: A-D converting circuit.

BEST MODE FOR CARRYING OUT THE INVENTION

A pulse modulator and a pulse wave radar device according to embodiments of the present invention are explained below with reference to the drawings. The pulse modulator and pulse wave radar device of the present invention are not limited to the following embodiments.

First Embodiment

The first embodiment relates to the pulse modulator applicable to the pulse wave radar device. Concretely, a pulse generating circuit of the pulse modulator is composed of an electronic circuit, which operates at low speed, and a pulse from the pulse generating circuit is differentiated by a differentiating circuit so as to be a spike-shaped differentiated wave. The spike-shaped differentiated wave can provide a waveform with narrower pulse width than that of the pulse from the pulse generating circuit. When the spike-shaped differentiated wave does not exceed a predetermined value, an oscillated wave from an oscillating circuit is cut off, and when the spike-shaped differentiated wave exceeds the predetermined value, the oscillated wave from the oscillating circuit is allowed to pass so that the pulse is modulated. Since the pulse generating circuit is composed of the electronic circuit, which operates at low speed, the cost and power consumption can be lowered. On the other hand, since the differentiating circuit is constituted simply, the pulse modulator, which outputs a modulated pulse wave with narrow pulse width, can be realized without greatly influencing the cost and the power consumption of the pulse modulator.

Figure 1:
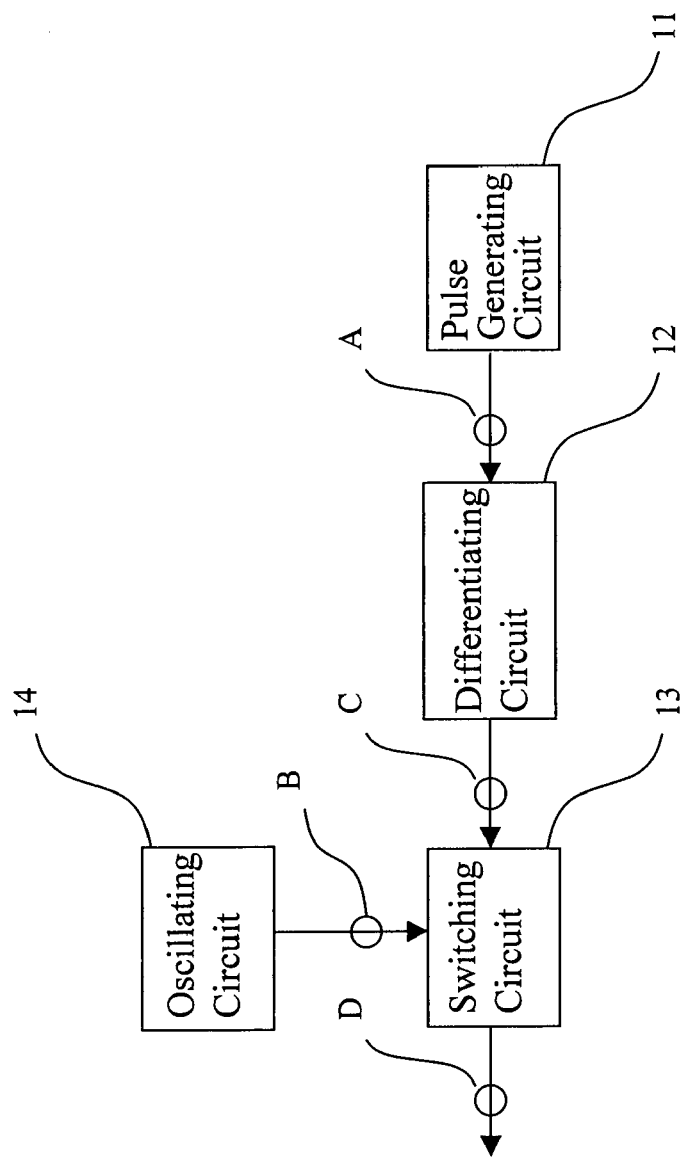
FIG. 1 is a block diagram explaining a schematic configuration of a pulse modulator according to an embodiment.
Figure 2:
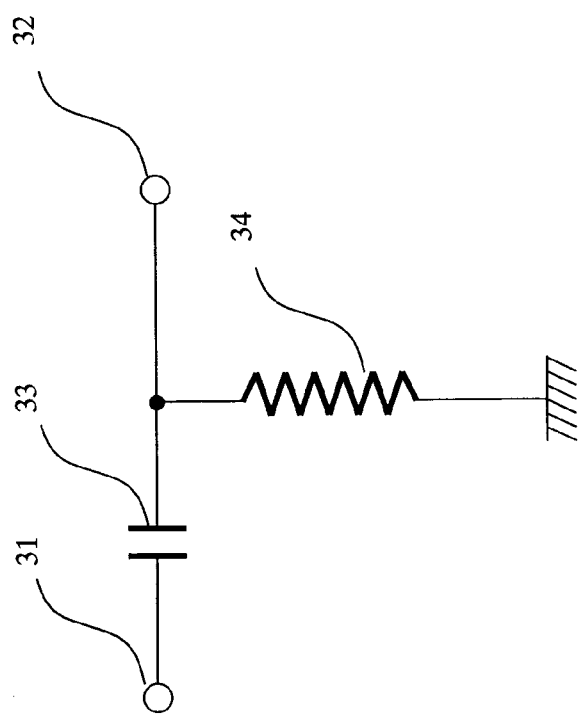
FIG. 2 is a configuration example of a primary high-pass filter applicable to the pulse modulator according to the embodiment.
Figure 3:
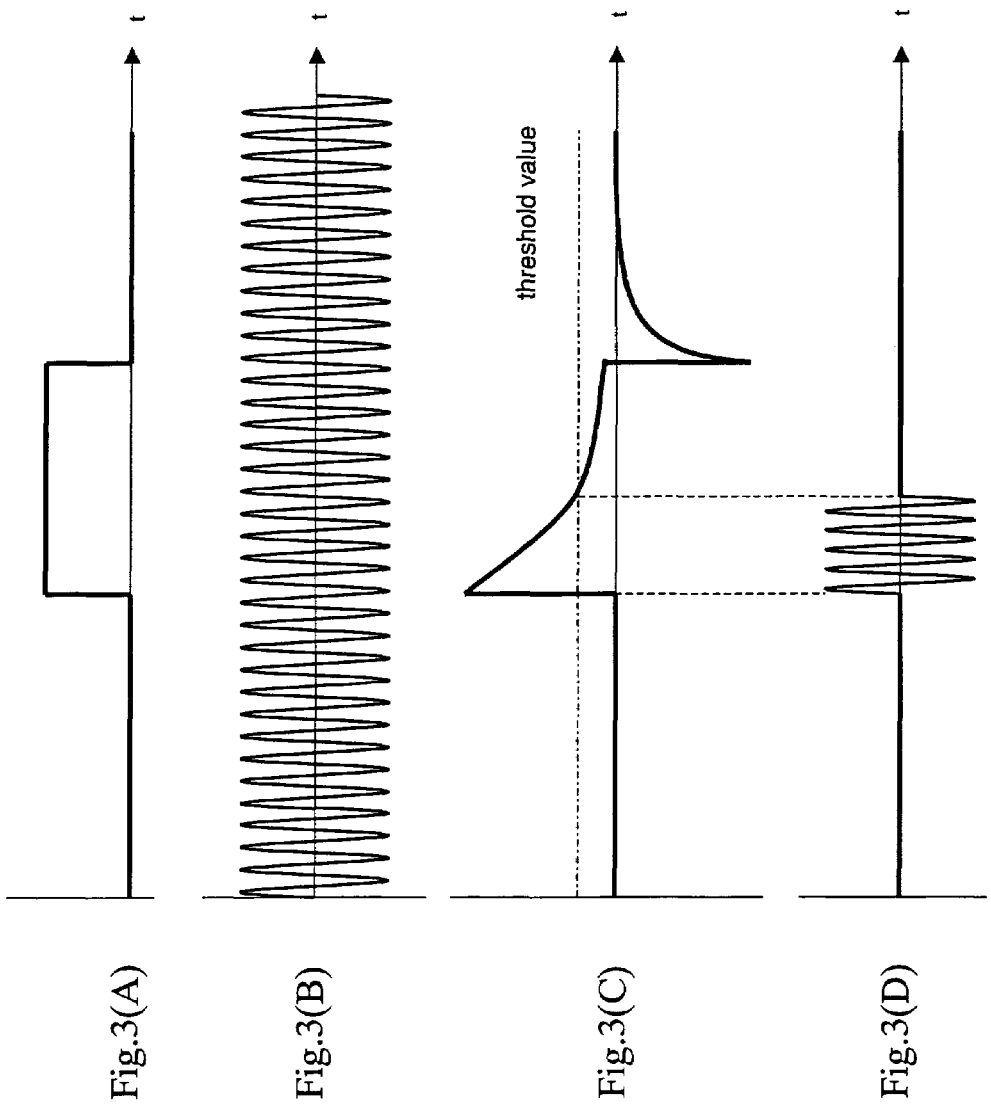
FIGS. 3A to 3D are timing charts explaining an operation of the pulse modulator according to the embodiment.

The pulse modulator according to the embodiment is explained with reference to FIGS. 1 to 3. FIG. 1 is a block diagram explaining a schematic configuration of the pulse modulator according to the embodiment, reference numeral 11 designates the pulse generating circuit which generates periodic pulses, 12 designates the differentiating circuit which differentiates the pulse from the pulse generating circuit 11 and outputs a spike-shaped differentiated wave, 13 designates a switching circuit which switches whether an oscillated wave from the oscillating circuit, mentioned later, is output and outputs a modulated pulse wave when the spike-shaped differentiated wave exceeds a predetermined value, and 14 designates the oscillating circuit which generates an oscillated wave of modulating frequency.

In a ordinary pulse modulator, a pulse generating circuit generates a pulse with narrow pulse width, but in the pulse modulator according to this embodiment, the pulse generating circuit composed of the electronic circuit which operates at low speed generates a pulse with wide width, and the differentiating circuit differentiates a pulse with wide width so that a spike-shaped differentiated wave with narrow width is obtained.

In FIG. 1, the pulse generating circuit 11 generates periodic pulses. The repeating cycle may be adjusted to a modulating device to which the pulse modulator is applied. The repeating cycle of an in-vehicle pulse wave radar device copes with a maximum measuring distance. For example, when the maximum measuring distance is set to 30 m, the repeating cycle is 200 nsec or more as the round-trip propagation time of a radio wave. When the pulse generating circuit is composed of a CMOS element, rise time and fall time of a generated pulse can be shortened up to about 1 nsec, thereby the pulse width can be narrow to about 3 nsec.

The differentiating circuit 12 differentiates a pulse from the pulse generating circuit 11. The differentiating circuit 12 may be composed of an active element or a passive element. When it is composed of the passive element, the cost and the power consumption can be low. An example where it is composed of the passive element is a primary high-pass filter. An example of the primary high-pass filter is shown in FIG. 2. FIG. 2 is a configuration example of the primary high-pass filter applicable to the pulse modulator according to this embodiment, reference numeral 31 designates an input terminal, 32 designates an output terminal, 33 designates a capacitor, and 34 designates resistance. When the pulse from the pulse generating circuit is input into the input terminal 31, a spike-shaped differentiated wave obtained by differentiating the pulse is output to the output terminal 32. Time constant which is determined by the capacitor 33 and the resistance 34 is set so as to be shorter than 3 nsec, the pulse with pulse width of 3 nsec can be a spike-shaped differentiated wave with narrower width than 3 nsec. FIG. 2 is an example of the primary high-pass filter, and the differentiating circuit according to this embodiment is not limited to this configuration.

In FIG. 1, the oscillating circuit 14 generates an oscillated wave of modulating frequency. For example, when the modulating frequency is 24 GHz, a sine wave of 24 GHz is generated.

The switching circuit 13 switches whether the oscillated wave from the oscillating circuit 14 is output according to the differentiated wave from the differentiating circuit 12. That is to say, when the differentiated wave from the differentiating circuit 12 exceeds a predetermined value, the oscillated wave from the oscillating circuit 14 is allowed to pass, and when the differentiated wave does not exceed the predetermined value, the oscillated wave from the oscillating circuit 14 is cut off. As a result, the switching circuit 13 outputs a modulated pulse wave. This output becomes a modulated pulse wave output from the pulse modulator. With such an operation, the modulated pulse wave with narrower pulse width than the width of the pulse generated from the pulse generating circuit can be obtained.

FIGS. 3A to 3D are timing charts explaining the operation of the pulse modulator according to this embodiment. FIGS.

3A, 3B, 3C and 3D show operating waveforms at points A, B, C and D in FIG. 1. FIG. 3A shows a pulse waveform from the pulse generating circuit, and when this pulse waveform is differentiated by the differentiating circuit, a waveform of FIG. 3C is obtained. Here, a large spike can be obtained at the rise and the fall of the pulse waveform. On the other hand, FIG. 3B shows an oscillated wave from the oscillating circuit. When the differentiated wave in FIG. 3C exceeds a threshold value in the switching circuit, the oscillated wave of FIG. 3B is output, and when it does not exceed the threshold value, the oscillated wave is cut off so that a pulse modulated wave shown in FIG. 3D is obtained.

Figure 4:
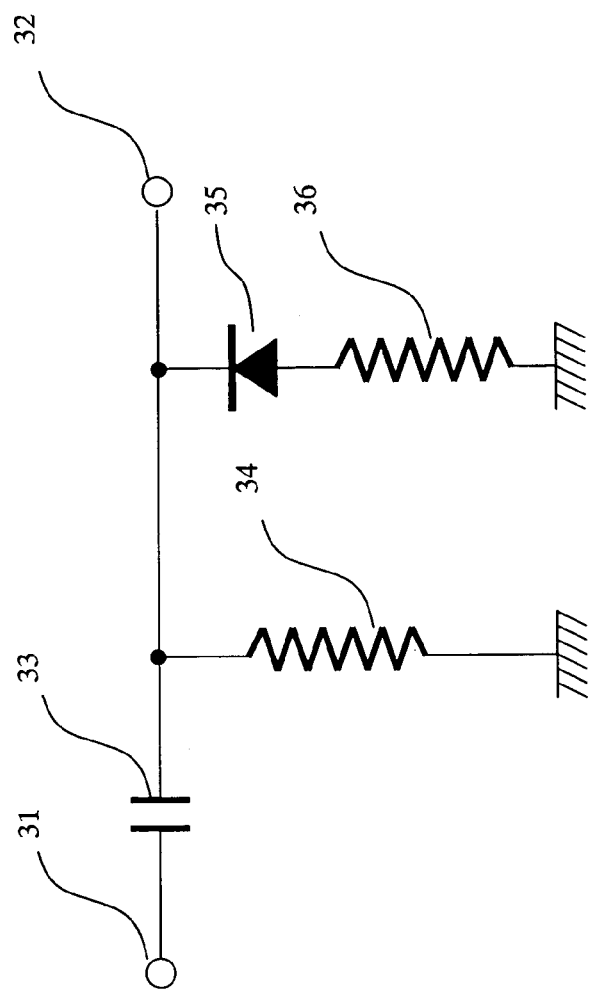
FIG. 4 is a configuration example where a clipping circuit is added to the primary high-pass filter applicable to the pulse modulator according to the embodiment.

In the pulse modulator shown in FIG. 1, a clipping circuit, which limits a crest value may be further provided between the differentiating circuit 12 and the switching circuit 13. FIG. 4 is an example provided with the clipping circuit at a later tier of the primary high-pass filter explained in FIG. 2. In FIG. 4, reference numeral 35 designates a diode, and 36 designates resistance. The same reference numerals as those in FIG. 2 have the same meanings.

In FIG. 4, the capacitor 33 and the resistance 34 compose the primary high-pass filter, and a pulse input from the input terminal 31 is differentiated so as to be a spike-shaped differentiated wave. The diode 35 limits a crest value of the spike on a minus side of the output from the primary high-pass filter, so as to output it to the output terminal 32. As a result, for example, even when an FET gate is connected to the output terminal 32, the minus side of the differentiated wave can be prevented from exceeding rating of input the element.

With such an operation, the clipping circuit shown in FIG. 4 can prevent a pulse wave with an excessive crest value from being input into the switching circuit 13 shown in FIG. 1. Here, the clipping circuit which limits the crest value on the minus side of the spike is an example, but a clipping circuit which limits a crest value of a plus side of the spike may be used, or a clipping circuit which limits the crest values of the minus side and the plus side of the spike may be used.

Figure 5:
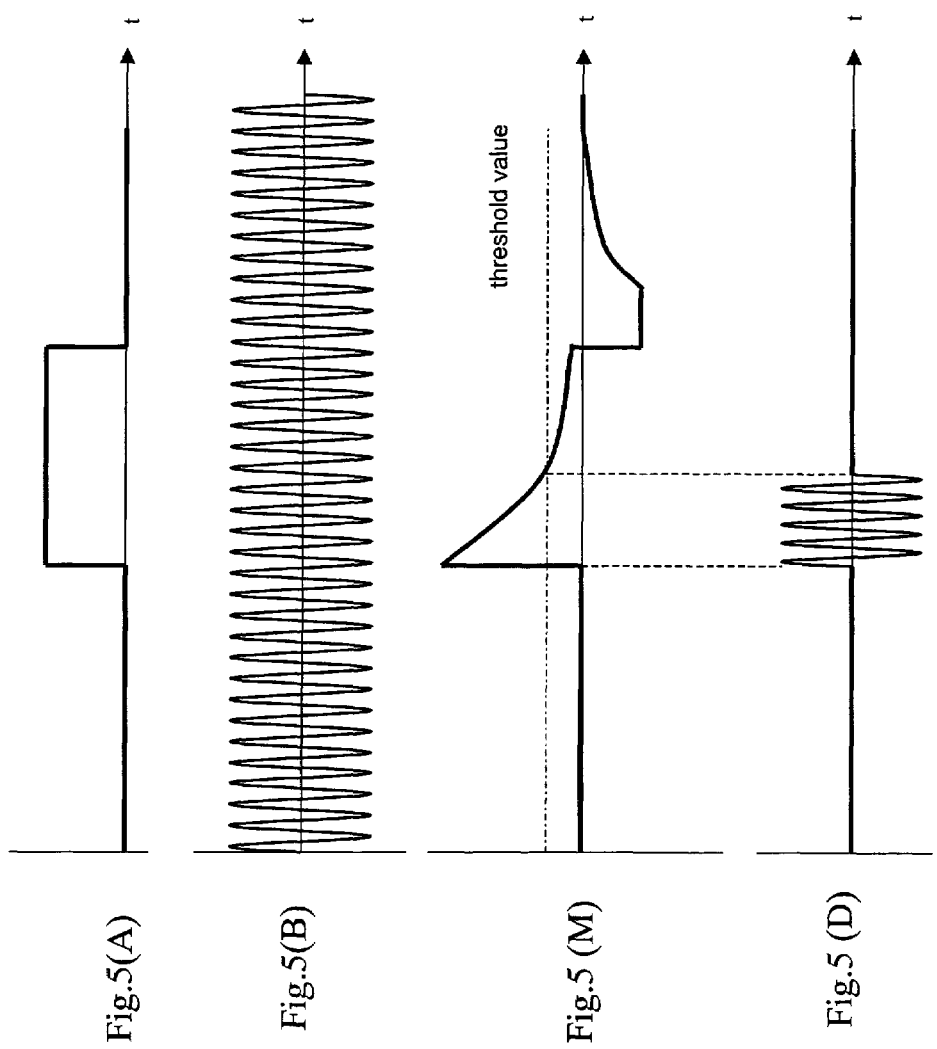
FIGS. 5A to 5D are timing charts explaining the operation of the pulse modulator according to the embodiment.

FIGS. 5A to 5D are timing charts explaining the operation of the pulse modulator having a spike circuit. FIGS. 5A, 5B and 5D show operating waveforms at points A, B and D in FIG. 1. FIG. 5M is an output from the clipping circuit provided at the later tier of the differentiating circuit. FIG. 5A shows a pulse waveform from the pulse generating circuit, and when this pulse waveform is differentiated by the differentiating circuit, the waveform of FIG. 3C is obtained. A large spike can be obtained at the rise and the fall of the pulse waveform. In the clipping circuit, when the crest value of the minus side of the spike is limited, the waveform of FIG. 5M is obtained. On the other hand, FIG. 5B shows an oscillated wave from the oscillating circuit. When the waveform of FIG. 5M exceeds a threshold value in the switching circuit, the oscillated wave of FIG. 5B is output, and when it does not exceed the threshold value, the oscillated wave is cut off, so that the pulse modulated wave shown in FIG. 5D is obtained.

In the pulse modulator according to this embodiment, therefore, even when the pulse generating circuit may be composed of a low-speed electronic circuit, a modulated pulse with narrow pulse width can be output by adding the differentiating circuit. Further, when the primary high-pass filter is utilized as the differentiating circuit, the pulse modulator can make the power consumption low with a simple element configuration. Further, when the clipping circuit is provided between the differentiating circuit and the switching circuit, a pulse wave of excessive crest value can be prevented from being input into the switching circuit.

Second Embodiment

The second embodiment relates to the pulse modulator applicable to the pulse wave radar device. Concretely, the pulse generating circuit of the pulse modulator is composed of the electronic circuit, which operates at low speed, and a predetermined frequency component is extracted from a pulse from the pulse generating circuit via a band-pass circuit. When the predetermined frequency component is extracted, a waveform can have a narrower pulse width than that of the pulse from the pulse generating circuit. When the waveform of the predetermined frequency component does not exceed a predetermined value, a oscillated wave from the oscillating circuit is cut off, and when the waveform of the predetermined frequency component exceeds the predetermined value, the oscillated wave from the oscillating circuit is allowed to pass so that the pulse is modulated. Since the pulse generating circuit is composed of the electronic circuit, which operates at low speed, the cost and the power consumption can be low. On the other hand, since the band-pass circuit can be configured simply, the pulse modulator, which outputs a modulated pulse wave with narrow pulse width can be realized without greatly influencing the cost and the power consumption of the pulse modulator.

Figure 6:
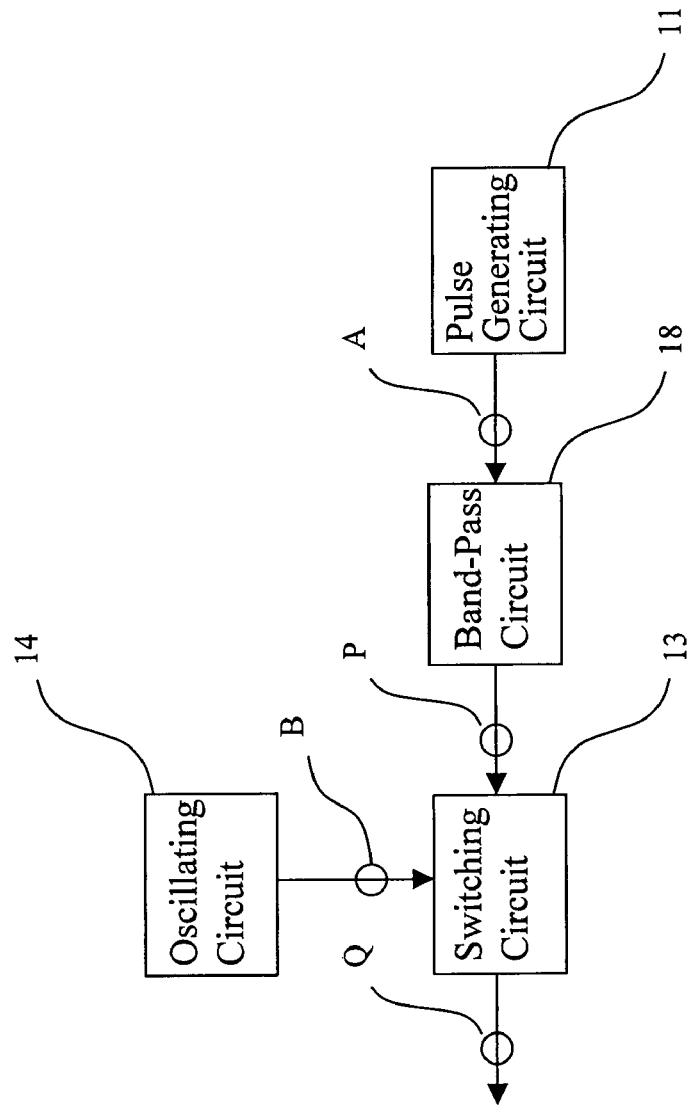
FIG. 6 is a block diagram explaining a schematic configuration of the pulse modulator according to the embodiment.

The pulse modulator according to this embodiment is explained with reference to FIGS. 6, 7 and 8. FIG. 6 is a block diagram explaining a schematic configuration of the pulse modulator according to this embodiment, reference numeral 11 designates the pulse generating circuit which generates periodic pulses, 18 designates a band-pass circuit which extracts and outputs a predetermined frequency component from the pulse from the pulse generating circuit 11, 13 designates a switching circuit which switches whether an oscillated wave from the oscillating circuit, mentioned later, is output so as to output a modulated pulse wave when the output from the band-pass circuit 18 exceeds a predetermined value, and 14 designates the oscillating circuit which generates an oscillated wave of the modulating frequency.

In a normal pulse modulator, the pulse generating circuit generates a pulse with narrow pulse width, but in the pulse modulator according to this embodiment, the pulse generating circuit composed of the electronic circuit which operates at low speed generates a pulse with wide width, and the band-pass circuit extracts a high-frequency component from the pulse with wide width so that a waveform with narrow width is obtained.

In FIG. 6, the pulse generating circuit 11 is same as that explained in FIG. 1. The band-pass circuit 18 extracts a predetermined frequency component from the pulse from the pulse generating circuit 11. The band-pass circuit 18 may be composed of an active element or a passive element. When it is composed of the passive element, the cost and the power consumption can be low. An example that the band-pass circuit 18 is composed of the passive element is a secondary band-pass filter. An example of the secondary band-pass filter is shown in FIG. 7. FIG. 7 is an configuration example of the secondary band-pass filter applicable to the pulse modulator according to this embodiment, reference numeral 31 designates the input terminal, 32 designates the output terminal, 33 designates the capacitor, 34 designates the resistance, and 37 designates the inductor. When the pulse from the pulse generating circuit is input into the input terminal 31, a waveform where a predetermined frequency component of the pulse is output from the output terminal 32. When a pass frequency which is determined by the capacitor 33, the resistance 34 and the inductor 37 is set so as to be shorter than an inverse of the pulse width 3 nsec generated from the pulse generating circuit, the pulse with the pulse width of 3 nsec can provide the waveform with narrower width than 3 nsec. FIG. 7 is an example of the secondary band-pass filter, but the band-pass circuit according to this embodiment is not limited to this configuration.

Figure 7:
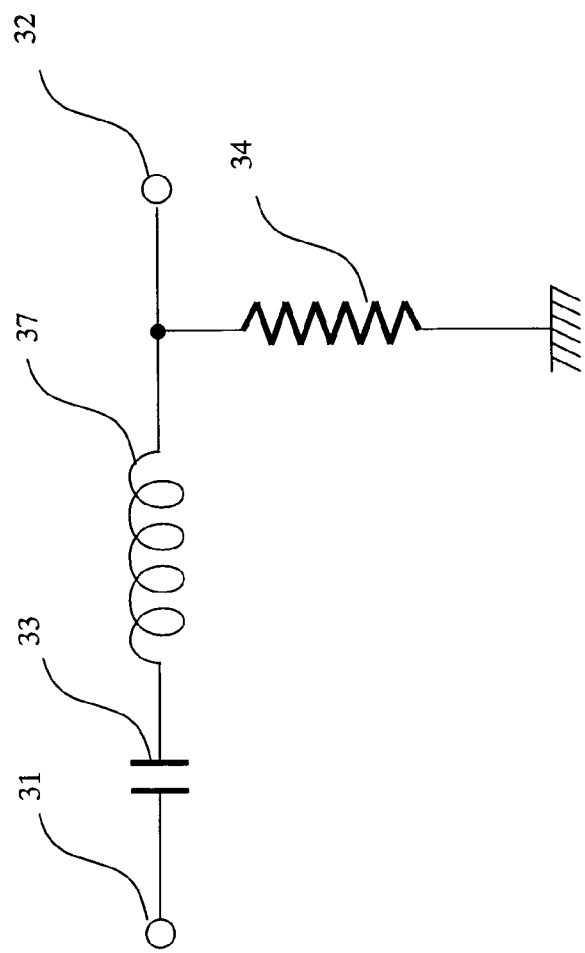
FIG. 7 is a configuration example of a secondary band-pass filter applicable to the pulse modulator according to the embodiment.
Figure 8:
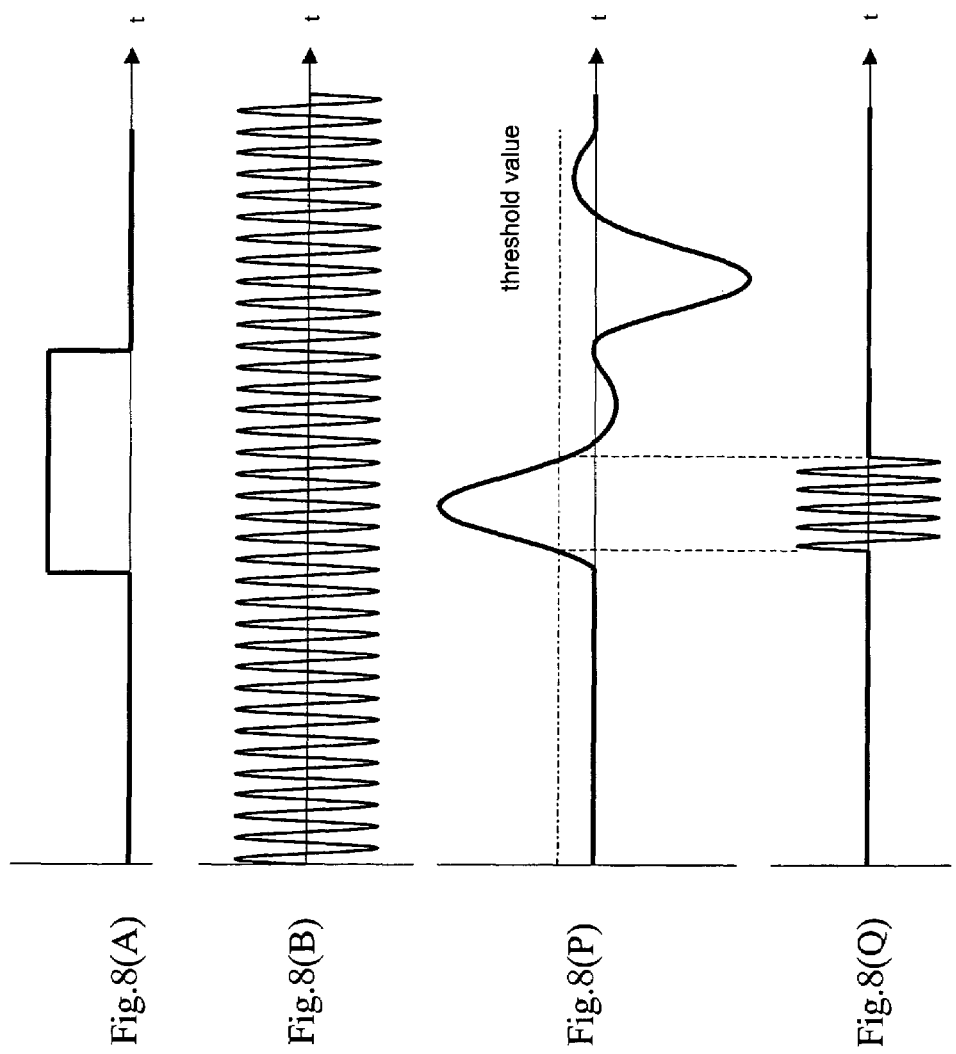
FIGS. 8A to 8Q are timing charts explaining the operation of the pulse modulator according to the embodiment.

Required characteristics of the secondary band-pass filter shown in FIG. 7 are explained here. When a pulse with pulse width of 30 nsec, rise/fall time of 200 psec and pulse crest value Vo of 3.3 to 5 V is input into the input terminal 31, a requirement of the inductor such that a difference of the crest value is 0.6 V or more is obtained for the output terminal 32. When respective parameters are set so that output impedance of the pulse generating circuit 11 which is connected to the input terminal 31 and drives the secondary band-pass filter is 10 to 75 ohm, a resistance value R of the resistance 34 is 50 to 150 ohm, and capacity C of the capacitor 33 is 1 to 10 pF, the following condition of the formula (1) is obtained:

$$L \leq 1.1 \times Vo \times R^2 \times C \quad (1)$$

With this condition, when the output terminal 32 is connected to the source-grounded FET gate, a voltage from gate to source where a path between drain and source of connected FET is sufficiently cut off can be −0.6 V or less.

In FIG. 6, the oscillating circuit 14 and the switching circuit 13 operate similarly to those in FIG. 1. That is to say, in FIG. 6, the switching circuit 13 switches whether the oscillated wave from the oscillating circuit 14 is output according to the waveform from the band-pass circuit 18. When the waveform from the band-pass circuit 18 exceeds a predetermined value, the oscillated wave from the oscillating circuit 14 is allowed to pass, and when the waveform does not exceed the predetermined value, the oscillated wave from the oscillating circuit 14 is cut off. As a result, the switching circuit 13 outputs a modulated pulse wave. This output becomes the modulated pulse wave to be output from the pulse modulator. With such an operation, the modulated pulse wave with narrower pulse width than the width of the pulse generated from the pulse generating circuit can be obtained.

FIGS. 8A to 8Q are timing charts explaining the operation of the pulse modulator according to this embodiment. FIGS. 8A, 8B, 8P and 8Q show the operating waveforms at points A, B, P and Q in FIG. 6. FIG. 8A is a pulse waveform from the pulse generating circuit, and when the pulse waveform is allowed to pass through the band-pass circuit, a waveform in FIG. 8P is obtained. A large spike is obtained at the rise and fall of the pulse waveform. On the other hand, FIG. 8B is an oscillated wave from the oscillating circuit. When the waveform in FIG. 8P exceeds a threshold value in the switching circuit, the oscillated wave in FIG. 8B is output, and when it does not exceed the threshold value, the oscillated wave is cut off and thus a pulse modulated wave shown in FIG. 8Q is obtained.

Figure 9:
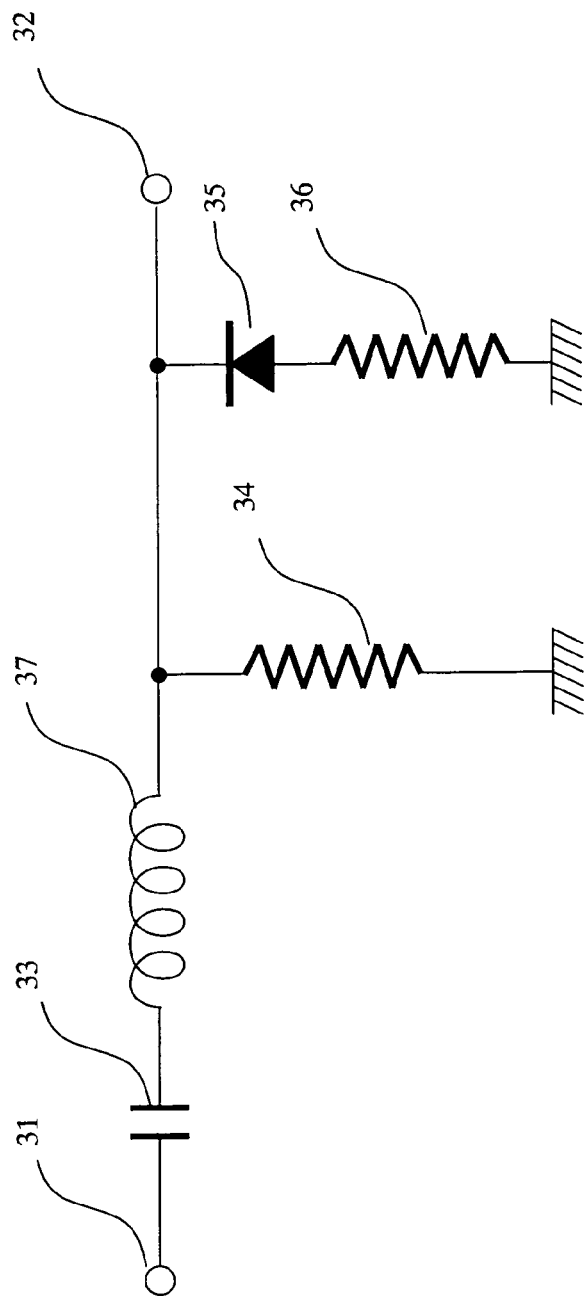
FIG. 9 is a configuration example where a clipping circuit is added to the secondary band-pass filter applicable to the pulse modulator according to the embodiment.

In the pulse modulator shown in FIG. 6, the clipping circuit which limits a crest value may be provided between the band-pass circuit 18 and the switching circuit 13. FIG. 9 is an example where the clipping circuit is provided to the later tier of the secondary band-pass filter explained in FIG. 7. In FIG. 9, reference numeral 35 designates a diode and 36 designates resistance. The same reference numerals as those in FIG. 7 have the same meanings.

In FIG. 9, the capacitor 33, the inductor 37 and the resistance 34 compose the secondary band-pass filter, and a waveform is obtained by extracting a predetermined frequency component from the pulse input from the input terminal 31. The diode 35 limits the crest value of the spike on the minus side of the output from the secondary band-pass filter so as to output it to the output terminal 32. As a result, for example, even if the FET gate is connected to the output terminal 32, the minus side of a differentiated wave can be prevented from exceeding rating of the element.

With such an operation, the clipping circuit shown in FIG. 9 can prevent the pulse wave with excessive crest value from being input into the switching circuit 13 shown in FIG. 6. The clipping circuit which limits the crest value of the minus side of the spike is exemplified here, but a clipping circuit which limits a crest value on the plus side of the spike may be used, or a clipping circuit which limits the crest values on the minus and plus sides of the spike may be used.

Figure 10:
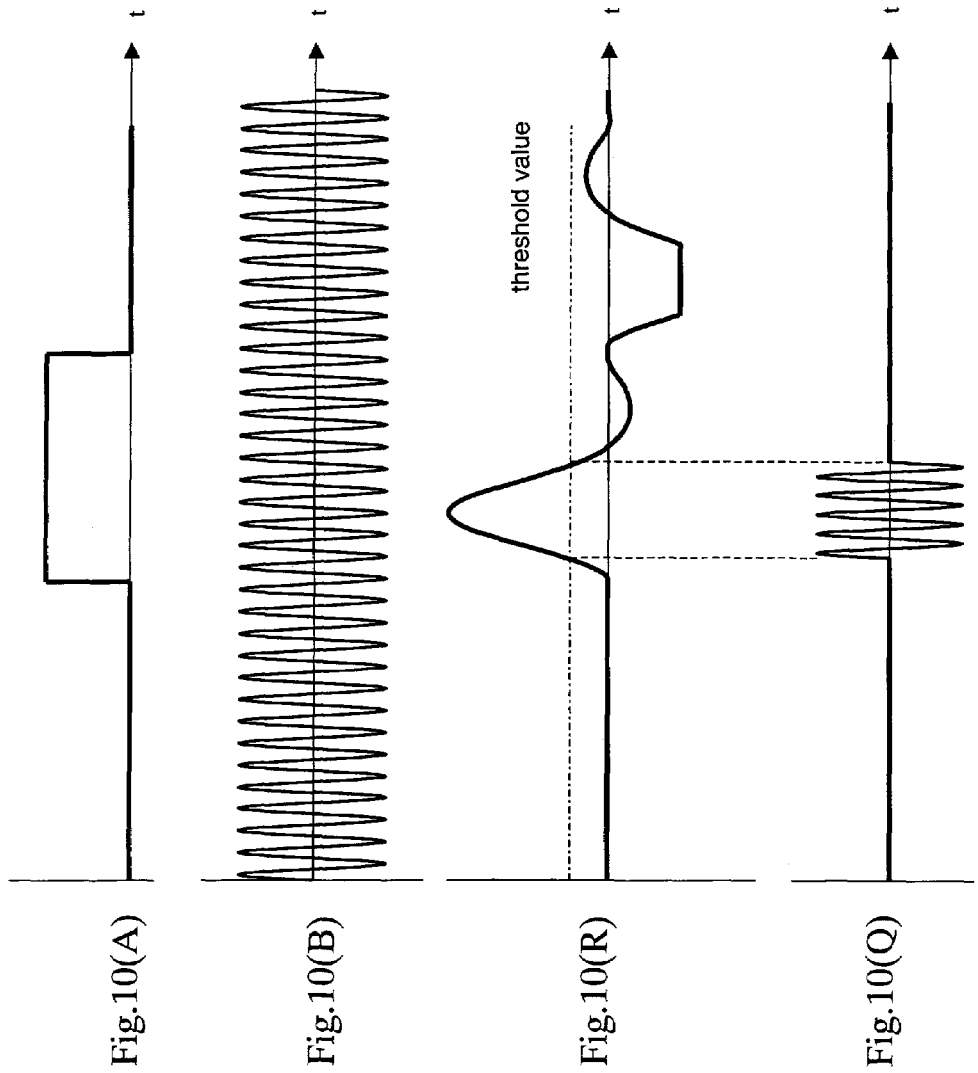
FIGS. 10A to 10Q are timing charts explaining the operation of the pulse modulator according to the embodiment.

FIGS. 10A to 10Q are timing charts explaining the operation of the pulse modulator having the clipping circuit. FIGS. 10A, 10B and 10Q show operating waveforms at points A, B and Q in FIG. 6. FIG. 10R is an output from the clipping circuit provided at the later tier of the band-pass circuit. FIG. 10A is a pulse waveform from the pulse generating circuit, and when a predetermined frequency component is extracted from this pulse waveform in the band-pass circuit, a waveform in FIG. 8P is obtained. A large spike can be obtained at the rise and the fall of the pulse waveform here. When the clipping circuit limits a crest value on the minus side of the spike in FIG. 8P, a waveform of FIG. 10R is obtained. On the other hand, FIG. 10B is an oscillated wave from the oscillating circuit. When the waveform of FIG. 10R exceeds a threshold value in the switching circuit, the oscillated wave in FIG. 10B is output, and when it does not exceed the threshold value, the oscillated wave is cut off, so that the pulse modulated wave in FIG. 10Q is obtained.

In the pulse modulator according to this embodiment, therefore, when the band-pass circuit is added, even if the pulse generating circuit is composed of the low-speed electronic circuit, the modulated pulse with narrow pulse width can be output. Further, when the secondary band-pass filter is used as the band circuit, the pulse modulator with low power consumption can be realized by the simple element structure. Furthermore, when the clipping circuit is provided between the band-pass circuit and the switching circuit, a pulse wave with excessive crest value can be prevented from being input into the switching circuit.

Third Embodiment

Figure 11:
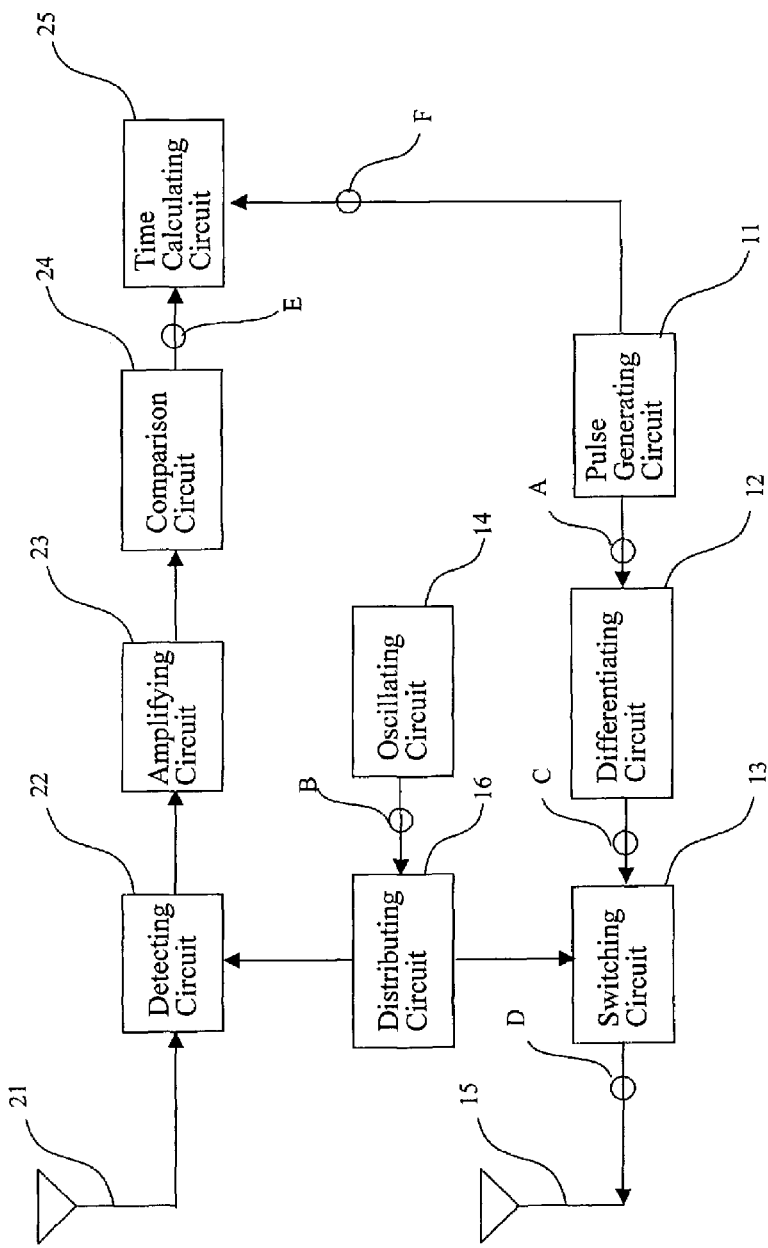
FIG. 11 is a block diagram explaining a schematic configuration of a pulse wave radar device according to the embodiment.

An embodiment of the pulse wave radar device to which the pulse modulator explained in the first embodiment is applied is shown in FIG. 11. Since parts, which are the same as or similar to those in FIG. 1 are designated by the same reference numerals, the explanation thereof is omitted.

The pulse wave radar device according to this embodiment is explained with reference to FIG. 11. FIG. 11 is a block diagram explaining a schematic configuration of the pulse wave radar device according to this embodiment, reference numeral 15 designates a transmitting antenna which transmits a modulated pulse wave, 16 designates a distributing circuit which distributes an oscillated wave from the oscillating circuit, 21 is a receiving antenna which receives a receiving wave reflected from the object, 22 designates a detecting circuit which mixes the receiving wave and the oscillated wave so as to amplitude-demodulate to the corresponding pulse, 23 designates an amplifying circuit which amplifies the detected pulse, 24 designates a comparison circuit which compares levels of the amplified pulse and a predetermined value, and 25 designates a time calculating circuit which detects time from the transmission of the modulated pulse wave to the reception of the receiving wave so as to calculate round-trip propagation time to the object.

It is desirable that the pulse modulator is a pulse modulator shown in FIG. 11. That is to say, the pulse generating circuit 11, the differentiating circuit 12, the switching circuit 13, the oscillating circuit 14 and the distributing circuit 16 compose the pulse modulator. In the case of the pulse modulator explained in the first embodiment is used as shown in FIG. 11, since the modulated pulse wave with narrow pulse width can be generated, even as to the object at short range, the round-trip propagation time can be measured. Further, a measuring error in the round-trip propagation time to the object can be reduced. The detecting circuit 22, the amplifying circuit 23, the comparison circuit 24, the oscillating circuit 14 and the distributing circuit 16 function as a receiving circuit.

The pulse wave radar device shown in FIG. 11 may further have the clipping circuit explained in the first embodiment. Further, the pulse modulator explained in the second embodiment may be used. The clipping circuit explained in the second embodiment may be further provided. The pulse wave radar device having the pulse modulator explained in the first embodiment is explained as an example.

In FIG. 11, the pulse modulator outputs a modulated pulse wave, and the transmitting antenna 15 transmits the modulated pulse wave. The receiving antenna 21 receives a receiving wave reflected from the object, and the detecting circuit 22 detects the receiving wave by an oscillated wave from the oscillating circuit 14 distributed via the distributing circuit 16. After the detection, the amplifying circuit 23 amplifies the detected wave, and the comparison circuit 24 compares the amplified wave with a predetermined value, so that a corresponding pulse is reproduced. The comparison circuit 24, which can identify an amplitude axial direction where the levels of the amplified wave and the threshold value can be compared, may be applied. For example, a gate circuit or a comparator circuit, which can variably change the threshold value can be applied.

The pulse wave radar device may be provided with the time calculating circuit 25, which detects the time from the transmission of a modulated pulse wave to the reception of a receiving wave so as to calculate the round-trip propagation time to the object if necessary. The distance to the object can be calculated based on the round-trip propagation time.

In the pulse wave radar device according to this embodiment, therefore, since the modulated pulse wave can have narrow pulse width, as to even the object at short range, the round-trip propagation time can be measured, and the measuring error in the round-trip propagation time to the object can be reduced.

In FIG. 11, the transmitting antenna 15 and the receiving antenna 21 are shown separately, but an antenna may be shared by reception and transmission. Further, with a directional antenna, the round-trip propagation time to the object in a specified direction can be calculated, and with a wide directional antenna, the round-trip propagation time to the object can be calculated at wide angle. The antenna may be installed to any places. In the case of an in-vehicle device, the antenna is provided into a front bumper, into an engine room or to a front portion of a driver's seat. This is applied to the following embodiments.

The time calculating circuit 25 detects the time from the transmission of a modulated pulse wave from the pulse wave radar device to the reception of a receiving wave so as to calculate the round-trip propagation time up to the object. In FIG. 11, the time calculating circuit 25 detects the time starting from the pulse generating circuit 11 generates a pulse, the switching circuit 13 outputs a modulated pulse wave where the pulse from the pulse generating circuit 1 is modulated by a differentiated wave from the differentiating circuit 12, the transmitting antenna 15 transmits the modulated pulse wave from the switching circuit 13, the receiving antenna 21 receives a receiving wave reflected from the object, the detecting circuit 22 detects the receiving wave from the receiving antenna 21, until the pulse which is amplitude-demodulated is input via the amplifying circuit 23 and the comparison circuit 24 into the time calculating circuit 25, so as to calculate the round-trip propagation time up to the object. The distance to the object can be calculated based on the round-trip propagation time.

The distance L (m) to the object is obtained according to the formula (2).

$$L = t_p \cdot C/2 \tag{2}$$

However, tp (sec) designates the time from the transmission of the modulated pulse wave from the pulse wave radar device to the reception of the receiving wave, and C (m/sec) designates a velocity of light. Since the pulse wave radar device detects the round-trip propagation time tp up to the object, the product of the time and the light velocity is divided by 2. It is preferable that propagation delay time in the respective circuits of the pulse wave radar device is measured previously, the measured time is subtracted from the time from the transmission of the modulated pulse wave from the pulse wave radar device to the reception of the receiving wave, and the round-trip propagation time up to the object is calculated in the time calculating circuit 25.

FIGS. 12E and 12F are timing charts explaining the operation of the pulse wave radar device according to this embodiment. FIGS. 12E and 12F show operating waveforms at points E and F in FIG. 11. FIG. 12E is a corresponding pulse from the comparison circuit, and FIG. 12F is a pulse from the pulse generating circuit.

Figure 12:
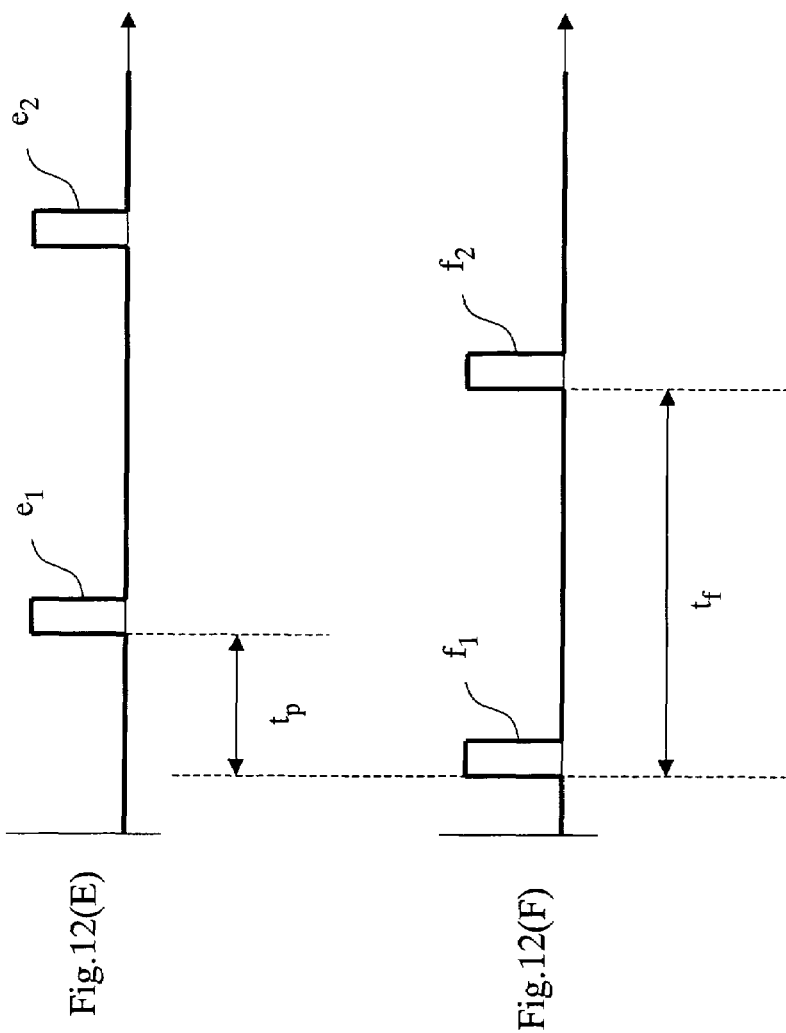
FIGS. 12E and 12F are timing charts explaining an operation of the pulse wave radar device according to the embodiment.

In FIG. 12, f1 and f2 designate pulses generated by the pulse generating circuit, and tf is a period of the pulse generated by the pulse generating circuit. e1 and e2 designate amplitude-demodulated pulses that are output from the comparison circuit 24, and the round-trip propagation time tp is generated between f1 and e1. This means that the object is present at the distance corresponding to the round-trip propagation time tp. The distance to the object can be calculated according to the formula (1).

A pulse counting system, a flip-flop circuit system or the like can be applied to the time calculating circuit. In the pulse counting system, the time when the pulse generating circuit 11 outputs a pulse is start timing, the time when the comparison circuit 24 outputs a corresponding pulse which is amplitude-demodulated is stop timing, and the time is calculated based on the number of pulses counted between these timings.

Figure 13:
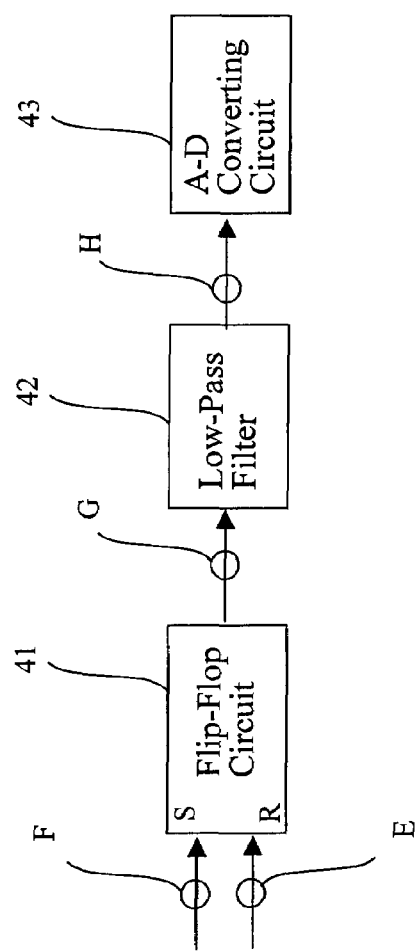
FIG. 13 is a block diagram explaining a part of a configuration of a time calculating circuit according to the embodiment.

FIG. 13 illustrates a block diagram explaining a part of the configuration of the time calculating circuit 25 in FIG. 11 as an example of the flip-flop circuit system. In FIG. 13, reference numeral 41 designates a flip-flop circuit, 42 designates a low-pass filter, and 43 designates an A-D converting circuit. The flip-flop circuit 41 is preferably a set/reset type. S of the flip-flop circuit 41 designates a set input terminal, and R designates a reset input terminal. The pulse from the pulse generating circuit 11 is input into the set input terminal S, and the pulse from the comparison circuit 24 is input into the reset input terminal R. When the time at which the modulated pulse wave reciprocates up to the object is short, the time from the set to the reset of the flip-flop circuit 41 becomes short. When the time at which the modulated pulse wave reciprocates up to the object is long, the time from the set to the reset of the flip-flop circuit 41 becomes long. When the output from the flip-flop circuit 41 is smoothed by the low-pass filter 42, a D.C. level corresponding to the round-trip time of pulse code up to the object is output. The A-D converting circuit 43 is provided as the need arises, and the D.C. level corresponding to the round-trip time of the pulse code up to the object may be converted into a digital signal.

FIGS. 14E to 14H are timing charts explaining the operation of the time calculating circuit shown in FIG. 13 according to this embodiment. FIGS. 14E, 14F, 14G and 14H show operating waveforms at points E, F, G and H in FIG. 13. FIG. 14E is an amplitude-demodulated from the comparison circuit and whose strength is modulated, FIG. 14F is a pulse from the pulse generating circuit, FIG. 14G is an output from the flip-flop circuit 41, and FIG. 14H is an output from the low-pass filter 42.

Figure 14:
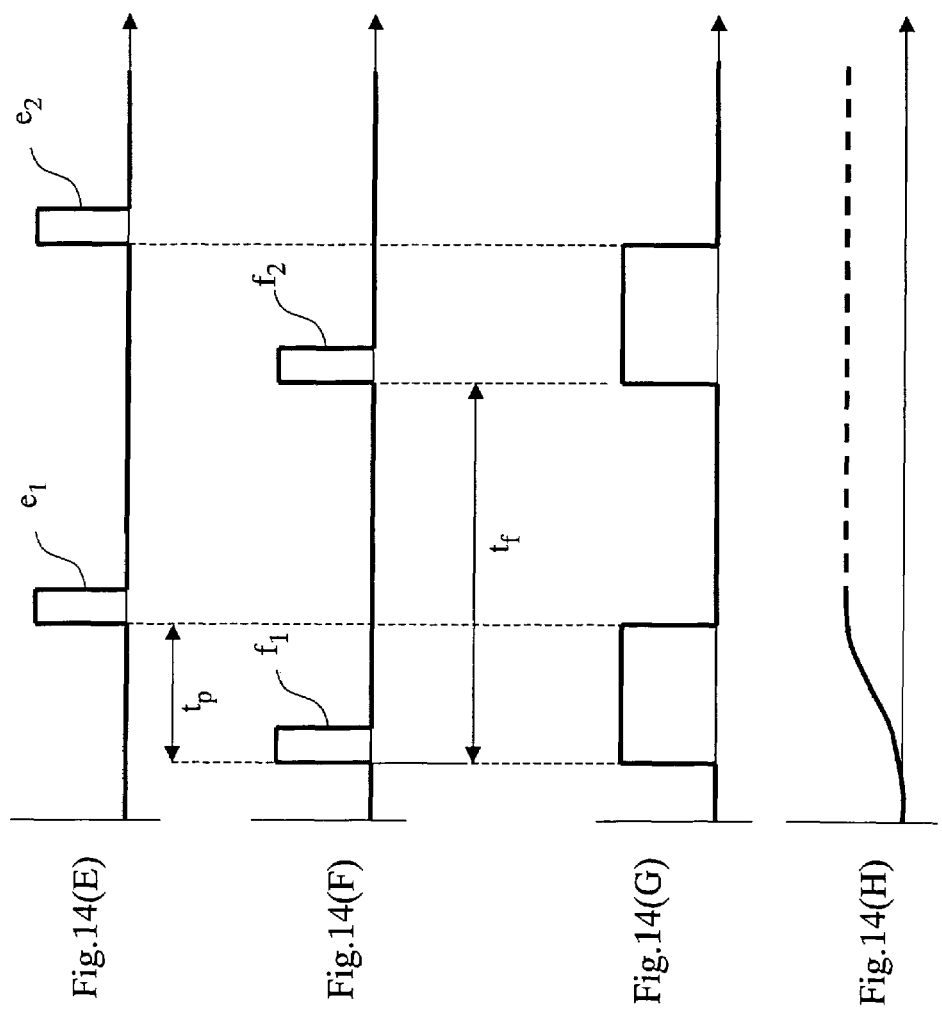
FIGS. 14E to 14H are timing charts explaining the operation of the time calculating circuit according to the embodiment.

In FIG. 14, when the pulse from the pulse generating circuit is input into the set input terminal of the flip-flop circuit (FIG. 14F), the flip-flop circuit is turned ON, and when the corresponding pulse from the comparison circuit is input into the reset input terminal of the flip-flop circuit (FIG. 14E), the flip-flop circuit is turned OFF (FIG. 14G). When a D.C. level is extracted from the output from the flip-flop circuit by the low-pass filter, an output in FIG. 14H is obtained. A signal at the D.C. level may be processed as an analog signal, or may be converted into a digital signal by the A-D converting circuit.

The period tf of the modulated pulse wave is desirably 10 MHz or less. In the case where a maximum detecting distance from the pulse wave radar device to the object is 16 m, when until a modulated pulse wave is transmitted and is reflected from the object so as to be returned, a next modulated pulse wave is transmitted, the object at the maximum detecting distance cannot be detected. When the object is present at the maximum detecting distance of 16 m, the round-trip time of the pulse code up to the object becomes 106 nsec. A clock frequency where 106 nsec is one period is 9.4 MHz. When the clock period of the transmitting signal is, therefore, 10 MHz or less, the maximum detecting distance of 16 m or more can be secured. This is applied also to the following embodiments.

The pulse width of the modulated pulse wave is desirably 600 psec or less. When the minimum detecting distance from the pulse wave radar device to the object is 10 cm, even if until a modulated pulse wave is transmitted and is reflected from the object at the distance of 10 cm so as to be returned, the transmission of this modulated pulse wave is not completed, the object at the minimum detecting distance cannot be detected. At the minimum detecting distance of 10 cm, the round-trip time of the pulse code becomes 666 psec. When the pulse width of the code of an RZ propagation signal is, therefore, 600 psec or less, the minimum detecting distance of 10 cm or less can be secured. This is applied also to the following embodiments.

Fourth Embodiment

Figure 15:
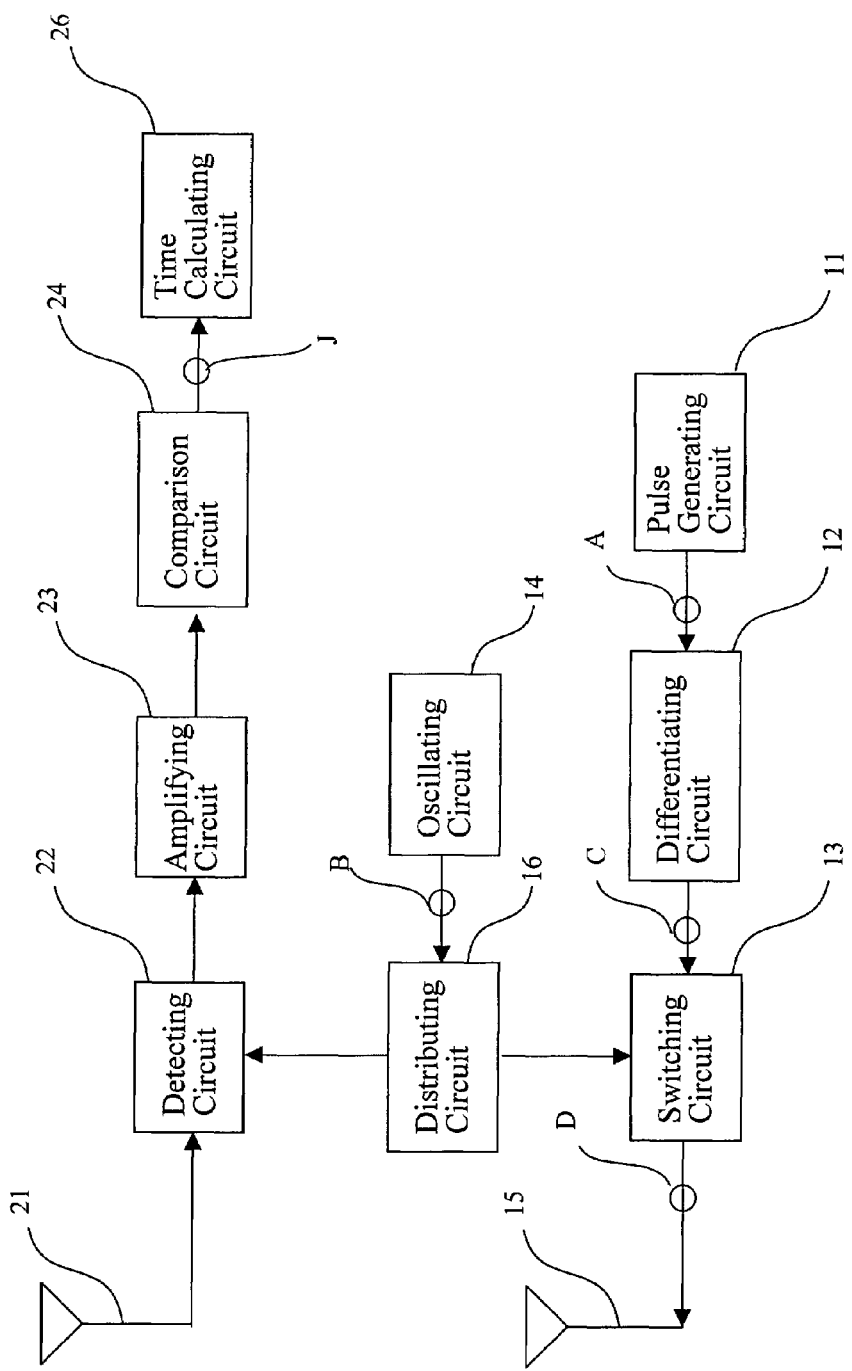
FIG. 15 is a block diagram explaining the schematic configuration of the pulse wave radar device according to the embodiment.

The pulse wave radar device according to another embodiment is shown in FIG. 15. The pulse wave radar device according to this embodiment is explained with reference to FIG. 15. FIG. 15 is a block diagram explaining a schematic configuration of the pulse wave radar device according to this embodiment, and since the same or corresponding parts are designated by the same reference numerals of FIG. 11, the explanation thereof is omitted. In FIG. 15, reference numeral 26 designates the time calculating circuit which calculates the round-trip propagation time up to the object. A difference of this device from the pulse wave radar device shown in FIG. 11 is that the detecting circuit 22 and the like composing the receiving circuit detects not only the received wave received by the receiving antenna 21 so as to amplitude-demodulate to a corresponding pulse but also a modulated pulse wave which leaks in the pulse wave radar device so as to amplitude-demodulate to a corresponding pulse.

The pulse modulator is desirably a pulse modulator shown in FIG. 15. That is to say, the pulse generating circuit 11, the differentiating circuit 12, the switching circuit 13, the oscillating circuit 14 and the distributing circuit 16 compose the pulse modulator. In the case where the pulse modulator explained in the first embodiment is used as the pulse modulator as shown in FIG. 15, since the modulated pulse wave with narrow pulse width can be generated, the round-trip propagation time up to even the object at the short range can be measured. Further, the measuring error in the round-trip propagation time up to the object can be reduced. The detecting circuit 22, the amplifying circuit 23, the comparison circuit 24, the oscillating circuit 14 and the distributing circuit 16 function as the receiving circuit.

The pulse wave radar device shown in FIG. 15 may be further provided with the clipping circuit explained in the first embodiment. The pulse modulator explained in the second embodiment may be adopted. Further, the clipping circuit explained in the second embodiment may be provided. The pulse wave radar device having the pulse modulator explained in the first embodiment is explained as an example.

In FIG. 15, the pulse modulator outputs a modulated pulse wave, and the transmitting antenna 15 transmits the modulated pulse wave. The receiving antenna 21 receives a receiving wave reflected from the object, and the detecting circuit 22 detects the received wave using an oscillated wave distributed from the oscillating circuit 14 via the distributing circuit 16. After the detection, the amplifying circuit 23 amplifies the detected wave, and the comparison circuit 24 compares the amplified wave with a predetermined value, so that the detected wave is amplitude-demodulated to a corresponding pulse. The comparison circuit 24, which can identify an amplitude axial direction where the wave is compared with a threshold value, may be applied. For example, a gate circuit or a comparator circuit, which can change the threshold value can be applied. Such a receiving circuit detects the received wave so as to amplitude-demodulate to a corresponding pulse.

In FIG. 15, the receiving circuit detects the received wave so as to amplitude-demodulate to a corresponding pulse, and further detects a modulated pulse wave, which leaks in the pulse radar device so as to amplitude-demodulate to a corresponding pulse. A modulated pulse wave leaks from the switching circuit 13 via a substrate or air in the device. Further, a modulated pulse wave leaks from the transmitting antenna 15 into the receiving antenna 21 or the detecting circuit 22.

The pulse wave radar device may be provided with the time calculating circuit 26 which detects the time from the transmission of the modulated pulse wave to the reception of the receiving wave so as to calculate the round-trip propagation time up to the object as the need arises. The distance to the object can be calculated based on the round-trip propagation time.

As explained in the third embodiment, when a pulse from the pulse generating circuit is input into the set input terminal of the flip-flop circuit, if dispersion of the internal delay in the pulse modulator and the receiving circuit is large, an error occurs in the calculation of the round-trip propagation time up to the object. In this embodiment, since the modulated pulse wave is input via the switching circuit 13 and the detecting circuit 22, an error hardly occurs in the calculation of the round-trip propagation time up to the object. Particularly as to the object at short range, slight dispersion of the internal delay causes an error, and thus this embodiment has a profound effect on the calculation of the round-trip propagation time up to the object at short range.

In FIG. 15, the transmitting antenna 15 and the receiving antenna 21 are shown separately, but the antenna may be shared by transmission and reception. The antenna, which is shared by transmission and reception can actively utilize a leakage in a circulator or the like. This is applied also to the following embodiment.

The time calculating circuit 26 detects the time from the transmission of a modulated pulse wave from the pulse wave radar device to the reception of the receiving wave so as to calculate the round-trip propagation time up to the object. In FIG. 15, the switching circuit 13 outputs a modulated pulse wave obtained by modulating a pulse from the pulse generating circuit 11 according to a differentiated wave from the differentiating circuit 12, and the transmitting antenna 15 transmits the modulated pulse wave from the switching circuit 13. The receiving antenna 21 or the detecting circuit 22 receives the modulated pulse wave, and after the receiving circuit amplitude-demodulates the modulated pulse wave to the corresponding pulse, the receiving antenna 21 receives a receiving wave reflected from the object. The time calculating circuit 26 detects the time until the receiving circuit amplitude-demodulate the reflected wave to the corresponding pulse so as to calculate the round-trip propagation time up to the object. The distance to the object can be calculated based on the round-trip propagation time. The distance L (m) to the object can be obtained according to the formula (2).

The time calculating circuit can adopt the pulse counting system, the flip-flop circuit system or the like. In the pulse counting system, the time when the comparison circuit 24 outputs a pulse corresponding to a modulated wave is start timing, and the time when the comparison circuit 24 outputs a pulse corresponding to a receiving wave is stop timing. The time is calculated according to a number of the pulses counted between these timings.

Figure 16:
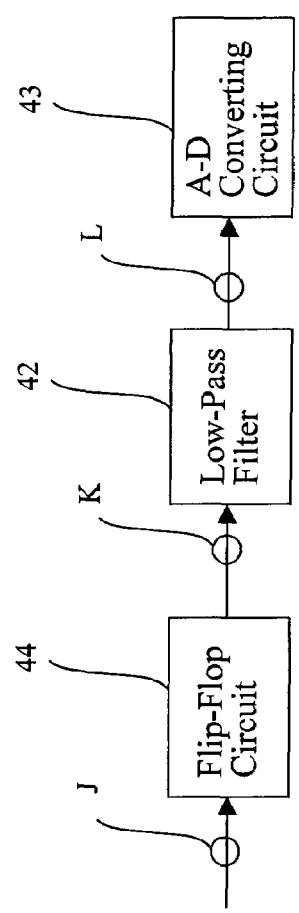
FIG. 16 is a block diagram explaining a part of the configuration of the time calculating circuit according to the embodiment.

As an example of the flip-flop circuit system, FIG. 16 shows a block diagram explaining a part of the configuration of the time calculating circuit 26 in FIG. 15. In FIG. 16, reference numeral 44 designates the flip-flop circuit, 42 designates the low-pass filter, and 43 designates the A-D converting circuit. The flip-flop circuit 44 is preferably of T type. When the round-trip time of a pulse code up to the object is short, the time from inversion to return of the flip-flop circuit 44 becomes short, and when the round-trip time of the pulse code up to the object is long, the time from inversion to return of the flip-flop circuit 44 becomes longer. When the output from the flip-flop circuit 44 is smoothed by the low-pass filter 42, a D.C. level according to the round-trip time of the pulse code up to the object is output. The A-D converting circuit 43 is provided as the need arises so that the D.C. level according to the round-trip time of the pulse code up to the object may be converted into a digital signal.

FIGS. 17J to 17L are timing charts explaining the operation of the pulse wave radar device according to this embodiment. FIGS. 17J, 17K and 17L show operating waveforms at points J, K and L in FIG. 16.

Figure 17:
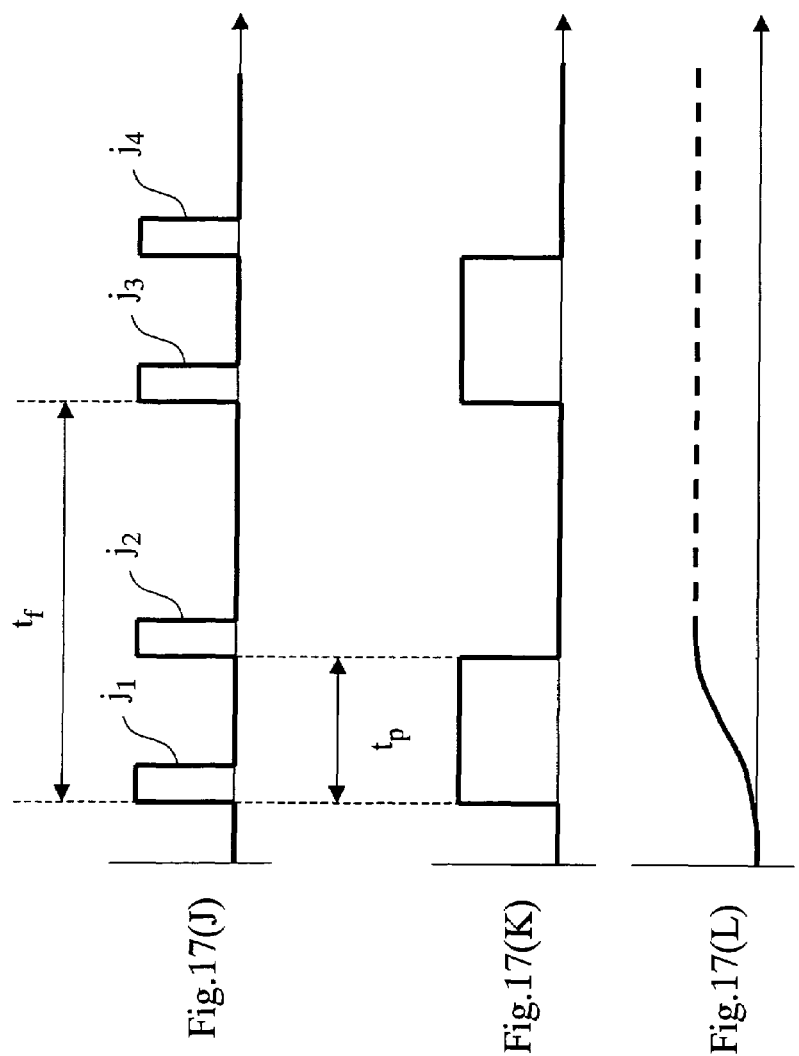
FIGS. 17J to 17L are timing charts explaining the operation of the pulse wave radar device according to the embodiment.

In FIG. 17, j1, j2, j3 and j4 are pulses generated from the comparison circuit, j1 and j3 are pulses corresponding to the modulated pulse wave, and j2 and j4 are pulse waves corresponding to the reflected wave. tf is a period of the pulse generated from the pulse generating circuit. Propagating round-trip time tp is generated between j1 and j2. This shows that the object is present at a distance corresponding to the round-trip propagation time tp. The distance to the object can be calculated according to the formula (2).

In FIG. 17, when the pulse j1 from the comparison circuit is input into the T type flip-flop circuit, the T type flip-flop circuit is inverted, and when the pulse j2 is input, the T type flip-flop circuit is returned (FIG. 17K). The low-pass filter extracts the D.C. level from the flip-flop circuit output as shown in FIG. 17L. The D.C. level signal may be processed as an analog signal or may be converted into a digital signal by the A-D converting circuit.

Since the pulse wave radar device according to this embodiment, therefore, adopts a circuit configuration which utilizes a modulated pulse with narrow pulse wave and has less influence of dispersion of the internal delay, the measuring error in the round-trip propagation time up to the object can be reduced.

Fifth Embodiment

Figure 18:
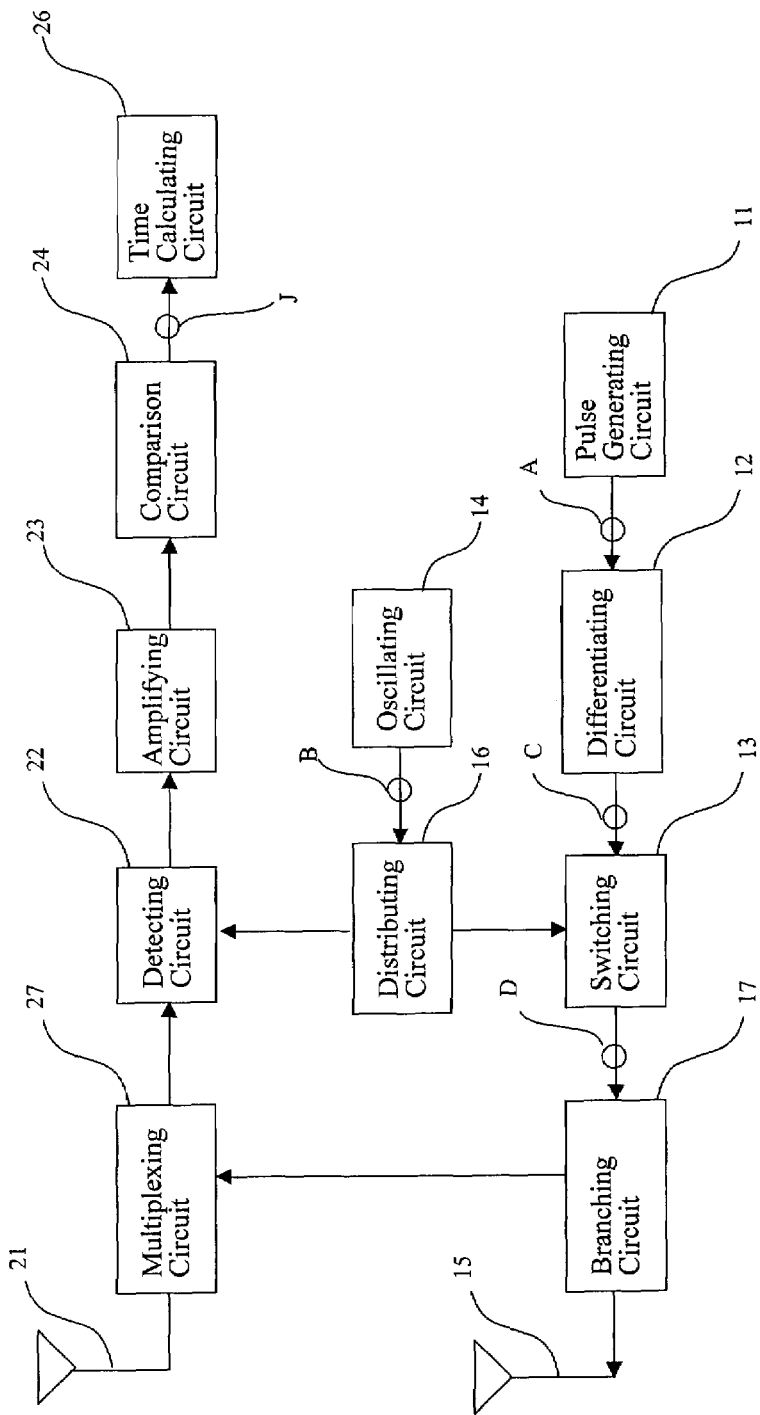
FIG. 18 is a block diagram explaining the schematic configuration of the pulse wave radar device according to the embodiment.

The pulse wave radar device according to another embodiment is shown in FIG. 18. The pulse wave radar device according to this embodiment is explained with reference to FIG. 18. FIG. 18 is a block diagram explaining a schematic configuration of the pulse wave radar device according to this embodiment, and since parts, which are the same as or correspond to those in FIG. 15 are designated by the same reference numerals, the description thereof is omitted. In FIG. 18, reference numeral 17 designates a branching circuit which branches a part of the modulated pulse wave from the switching circuit 13, and 27 designates a multiplexing circuit which multiplexes the received wave from the receiving antenna 21 and a part of the modulated pulse wave from the branching circuit 17. A difference from the pulse wave radar device shown in FIG. 15 is that the modulated pulse wave is actively branched and is detected by the receiving circuit so as to amplitude-demodulate to a corresponding pulse.

The pulse modulator shown in FIG. 18 is desirable. That is to say, the pulse generating circuit 11, the differentiating circuit 12, the switching circuit 13, the oscillating circuit 14 and the distributing circuit 16 compose the pulse modulator. When the pulse modulator shown in FIG. 18 is used like the first embodiment, since the modulated pulse wave with narrow pulse width can be generated, the round-trip propagation time up to even the object at short range can be measured, and the measuring error in the round-trip propagation time up to the object can be reduced. The detecting circuit 22, the amplifying circuit 23, the comparison circuit 24, the oscillating circuit 14 and the distributing circuit 16 function as the receiving circuit.

The pulse wave radar device shown in FIG. 18 may be further provided with the clipping circuit explained in the first embodiment. Further, the pulse modulator explained in the second embodiment may be adopted. The clipping circuit explained in the second embodiment may be further provided. The pulse wave radar device having the pulse modulator explained in the first embodiment is explained here as an example.

In FIG. 18, the pulse modulator outputs a modulated pulse, and the transmitting antenna 15 transmits a modulated pulse wave which passes through the branching circuit 17. A part of the modulated pulse wave branched by the branching circuit 17 is multiplexed by the multiplexing circuit 27, and is detected by the detecting circuit 22 according to an oscillated wave distributed from the oscillated circuit 14 via the distributing circuit 16. After the detection, the amplifying circuit 23 amplifies the detected wave, and the comparison circuit 24 compares the amplified wave with a predetermined value, so that the amplified wave is amplitude-demodulated to a corresponding pulse. The comparison circuit 24 which can identify the amplitude axial direction where the wave is compared with a threshold value may be applied. For example, a gate circuit or a comparator circuit, which can change the threshold value can be applied. Such a receiving circuit detects a received wave so as to amplitude-demodulate to a corresponding pulse.

The receiving wave reflected from the object is received by the receiving antenna 21, and the reflecting wave is amplitude-demodulate to a corresponding pulse similarly to the branched modulated pulse wave.

The pulse wave radar device may be provided with the time calculating circuit 26, which detects the time from transmission of the modulated pulse wave to reception of the receiving wave so as to calculate the round-trip propagation time up to the object, as the need arises. The distance up to the object can be calculated based on the round-trip propagation time.

As explained in the third embodiment, when the pulse from the pulse generating circuit is input into the set input terminal of the flip-flop circuit, if dispersion of the internal delay in the pulse modulator or the receiving circuit is large, an error occurs in the calculation of the round-trip propagation time up to the object. In this embodiment, since also the modulated pulse wave is input via the switching circuit 13 and the detecting circuit 22, an error hardly occurs in the calculation of the round-trip propagation time up to the object. Since slight dispersion of the internal delay becomes an error particularly in the case of the object at short range, this embodiment has a great effect on the calculation of the round-trip propagation time up to the object at short range.

In FIG. 18, the transmitting antenna 15 and the receiving antenna 21 are shown separately, but an antenna, which is shared by transmission and reception may be used. The time calculating circuit 26 is similar to that explained in the fourth embodiment.

Since the pulse wave radar device according to this embodiment, therefore, adopts the circuit configuration, which utilize the modulated pulse with narrow pulse width and has a less influence of the dispersion of the internal delay, the measuring error in the round-trip propagation time up to the object can be reduced. Further, since the modulated pulse wave can be received with good level accuracy, the round-trip propagation time up to the object can be calculated securely.

INDUSTRIAL APPLICABILITY

The pulse wave radar device of the present invention can be not only of in-vehicle type but also of fixed type or can be utilized in the field of the pulse wave radar device for short range.

The invention claimed is:

1. A pulse wave radar device, comprising:
a pulse generating circuit configured to generate a periodic pulse;
a differentiating circuit configured to differentiate the periodic pulse from the pulse generating circuit so as to output a differentiated wave;
an oscillating circuit configured to generate an oscillated wave with a modulating frequency;
a switching circuit configured to output the oscillated wave from the oscillating circuit according to the differentiated wave from the differentiating circuit so as to output a modulated pulse wave;
a transmitting antenna configured to transmit the modulated pulse wave from the switching circuit;
a receiving antenna configured to receive a received wave reflected from an object; and
a receiving circuit configured to detect the received wave from the receiving antenna so as to amplitude-demodulate to a corresponding pulse.

2. The pulse wave radar device according to claim 1, wherein the differentiating circuit is a primary high-pass filter.

3. The pulse wave radar device according to claim 1, further comprising a clipping circuit configured to limit a crest value between the differentiating circuit and the switching circuit.

4. A pulse modulator, comprising:
a pulse generating circuit configured to generate a periodic pulse;
a band-pass circuit configured to allow a specified frequency component of the pulse from the pulse generating circuit to pass therethrough;
an oscillating circuit configured to generate an oscillated wave of a modulating frequency; and
a switching circuit configured to output the oscillated wave from the oscillating circuit according to an output from the band-pass circuit so as to output a modulated pulse wave.

5. The pulse modulator according to claim 4, wherein the band-pass circuit is a secondary band-pass filter.

6. The pulse modulator according to claim 4, further comprising a clipping circuit configured to limit a crest value between the band-pass circuit and the switching circuit.

7. The pulse wave radar device according to claim 1, further comprising a time calculating circuit configured to detect a time from transmission of the modulated pulse wave to reception of the received wave so as to calculate round-trip propagation time up to the object.

8. The pulse wave radar device according to claim 1, wherein the receiving circuit detects the received wave from the receiving antenna and the modulated pulse wave which leaks in the pulse wave radar device so as to amplitude-demodulate to a corresponding pulse.

9. The pulse wave radar device according to claim 8, further comprising a time calculating circuit configured to detect an interval from a time the receiving circuit amplitude-demodulates the modulated pulse wave to the corresponding pulse to a time the receiving circuit amplitude-demodulates the received wave to the corresponding pulse so as to calculate a round-trip propagation time up to the object.

10. The pulse wave radar device according to claim 1, further comprising:
a branching circuit that branches a part of the modulated pulse wave from the switching circuit so as to output said part of the modulated pulse,
wherein the receiving circuit detects the received wave from the receiving antenna and the modulated pulse wave from the branching circuit so as to amplitude-demodulate to a corresponding pulse.

11. The pulse wave radar device according to claim 10, further comprising a time calculating circuit configured to detect an interval from a time the receiving circuit amplitude-demodulates the modulated pulse wave to the corresponding pulse to a time the receiving circuit amplitude-demodulates the received wave to the corresponding pulse so as to calculate a round-trip propagation time up to the object.

12. A pulse wave radar device, comprising:
a pulse modulator including
a pulse generating circuit configured to generate a periodic pulse,
a band-pass circuit configured to allow a specified frequency component of the pulse from the pulse generating circuit to pass therethrough,
an oscillating circuit configured to generate an oscillated wave of a modulating frequency, and
a switching circuit configured to output the oscillated wave from the oscillating circuit according to an output from the band-pass circuit so as to output a modulated pulse wave;
a transmitting antenna configured to transmit the modulated pulse wave from the pulse modulator;
a receiving antenna configured to receive a received wave reflected from an object; and
a receiving circuit configured to detect the received wave from the receiving antenna so as to amplitude-demodulate to a corresponding pulse.

13. The pulse wave radar device according to claim 12, further comprising a time calculating circuit that detects a time from transmission of the modulated pulse wave to reception of the received wave so as to calculate round-trip propagation time up to the object.

14. The pulse wave radar device according to claim 12, wherein the receiving circuit is configured to detect the received wave from the receiving antenna and the modulated pulse wave which leaks in the pulse wave radar device so as to amplitude-demodulate to a corresponding pulse.

15. The pulse wave radar device according to claim 14, further comprising a time calculating circuit configured to detect an interval from a time the receiving circuit amplitude-demodulates the modulated pulse wave to the corresponding pulse to a time the receiving circuit amplitude-demodulates the received wave to the corresponding pulse so as to calculate a round-trip propagation time up to the object.

16. The pulse wave radar device according to claim 12, further comprising:
a branching circuit configured to branch a part of the modulated pulse wave from the pulse modulator so as to output said part of the modulated pulse wave,
wherein the receiving circuit is configured to detect the received wave from the receiving antenna and the modulated pulse wave from the branching circuit so as to amplitude-demodulate to a corresponding pulse.

17. The pulse wave radar device according to claim 16, further comprising a time calculating circuit configured to detect an interval from a time the receiving circuit amplitude-demodulates the modulated pulse wave to the corresponding pulse to a time the receiving circuit amplitude-demodulates the received wave to the corresponding pulse so to calculate a round-trip propagation time up to the object.

* * * * *